United States Patent [19]

Whatley

[11] Patent Number: 4,713,625
[45] Date of Patent: Dec. 15, 1987

[54] CIRCUIT FOR IMPROVING POWER SUPPLY REJECTION IN AN OPERATIONAL AMPLIFIER WITH FREQUENCY COMPENSATION

[75] Inventor: Roger A. Whatley, Georgetown, Tex.

[73] Assignee: Motorola, Inc., Schaumburg, Ill.

[21] Appl. No.: 941,878

[22] Filed: Dec. 15, 1986

[51] Int. Cl.⁴ ............................................. H03F 1/26
[52] U.S. Cl. .................................... 330/149; 330/297
[58] Field of Search ................ 330/149, 151, 277, 297

[56] References Cited

U.S. PATENT DOCUMENTS 4,578,603 3/1986 McPherson .......................... 330/277

Primary Examiner—Gene Wan
Attorney, Agent, or Firm—John A. Fisher; Jeffrey Van Myers; Robert L. King

[57] ABSTRACT

A high gate output stage for use with an amplifier which has high power supply rejection and which is stable at all frequencies is provided. An output current source and current sink are connected in series with a Miller capacitor coupled between an input terminal and output terminal of the output stage. Error signals coupled from a power supply source are allowed to sum at the output terminal with a compensating signal. Compensation circuitry is coupled to the input terminal for charge coupling a substantially equal but opposite amount of compensation charge related to the error signal from the power supply, thereby substantially cancelling power supply error signal coupling. Therefore, excellent power supply rejection and frequency stability are provided in a high gain output stage.

6 Claims, 3 Drawing Figures

CIRCUIT FOR IMPROVING POWER SUPPLY REJECTION IN AN OPERATIONAL AMPLIFIER WITH FREQUENCY COMPENSATION

TECHNICAL FIELD

This invention relates generally to operational amplifier circuits, and more particularly, to high gain operational amplifier circuits.

BACKGROUND ART

Operationsl and differential amplifiers often utilize a high gain output stage to provide an amplified output signal. A known output stage comprises a series-connected current source and current sink transistor wherein the current sink transistor uses a control electrode for receiving a signal from an amplifier stage and a current electrode for providing the output signal. A frequency compensation capacitor is commonly connected between the control electrode and current electrode of the current sink transistor for frequency stability purposes commonly referred to as "Miller" or "pole-splitting" compensation. An example of a conventional operational amplifier structure with Miller compensation is illustrated by Paul Gray and Robert Meyer in "MOS Operational Amplifier Design-A Tutorial Overview" in the IEEE *Journal of Solid-State Circuits*, Volume SC-17, No. 6, December 1982, pages 969–982, at page 971. At frequencies other than low frequencies, the frequncy compensating capacitor is effectively an A.C. short circuit which substantially increases the gain of the current sink transistor from the source electrode to the output terminal of the amplifier. As a result, power supply rejection is significantly degraded. Paul Gray and Robert Meyer also note at page 977 of the above mentioned article that a cascode transistor may be used to buffer the frequency stabilizing capacitor from the current sink transistor. Another cascoded operational amplifier with high power supply rejection is illustrated by David Ribner and Miles Copeland in "Design Techniques for Cascoded CMOS Op Amps with Improved PSRR and Common-Mode Input Range" in the IEEE *Journal of Solid-State Circuits*, Vol. SC-19, No. 6, December 1984 at page 919. However, as noted by Ribner and Copeland at page 923, there exists potential frequency stability problems when the cascode compensation scheme is used. In some operational amplifier applications, notably those where the gain stage must have very high transconductance, the cascode mechanism for instability becomes a serious problem.

BRIEF DESCRIPTION OF THE INVENTION

Accordingly, an object of the present invention is to provide an improved circuit for improving power supply rejection and frequency stability in an operational amplifier.

Another object of the present invention is to provide an improved high gain output drive operational amplifier.

A further object of the present invention is to provide an improved method for improving power supply rejection and frequency stability in an operational amplifier.

In carrying out the above and other objects of the present invention, there is provided, in one form, an output gain stage for use with an amplifier. The gain stage is adapted to receive an input signal at an input terminal and provide an output signal with high power supply rejection and frequency stability compensation. An ouput portion for receiving and amplifying the input signal provides the output signal at an output terminal. The output portion comprises a current source coupled in series with a current sink transistor and a frequency stabilizing capacitor coupled between the input terminal and the output terminal. The output signal has an error component of predetermined polarity resulting from error signals in a power supply coupled thereto. Power supply compensation circuitry is coupled to the input terminal. The power supply compensation circuitry couples a compensation component to the output signal. The compensation component has a magnitude proportional to the error component and a polarity opposite the predetermined polarity.

These and other objects, features and advantages will be more clearly understood from the following detailed description taken in conjunction with the accompanying drawings.

BRIEF DESCRIPTION OF THE DRAWINGS

Shown in FIG. 1 in partial schematic diagram form is a common-source amplifier gain stage known in in the art;

Shown in FIG. 2 in partial schematic diagram form is a cascoded gain stage known in the art; and Shown in FIG. 3 in partial schematic form is an operational amplifier output gain stage in accordace with the present invention.

DETAILED DESCRIPTION OF THE INVENTION

Figure 1:
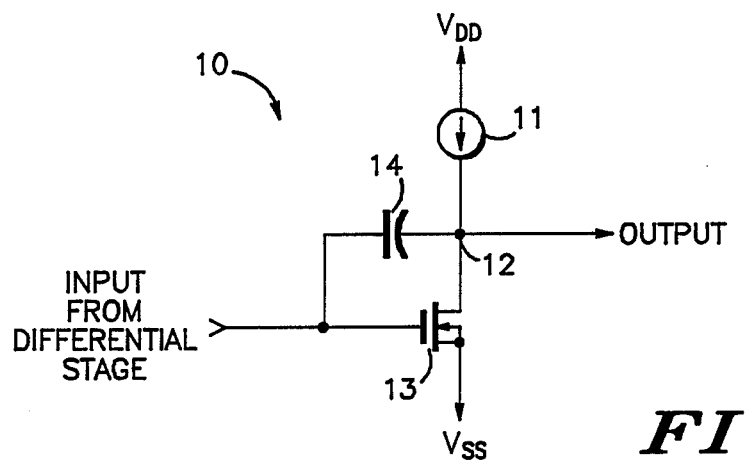

Shown in FIG. 1 is a known output driver 10 which functions as a high gain output stage for an amplifier. A current source 11 has a first terminal connected to a positive power supply labeled "$V_{DD}$". A second terminal of current source 11 is connected to an output terminal 12 for providing an output signal. A drain of an N-channel transistor 13 and a first electrode of a capacitor 14 are connected to output terminal 12. A second electrode of capacitor 14 is connected to a gate of transistor 13 and to an input from a differential amplifier stage. A source of transistor 13 is connected to a substrate thereof and to a negative power supply voltage labeled "$V_{SS}$".

In operation, output driver 10 is a conventional output drive stage which receives an input signal from an amplifier such as a differential amplifier stage and amplifies the signal by a high gain factor. Capacitor 14 is known as a "Miller" frequency compensation or "frequency pole-splitting" compensation capacitor. Capacitor 14 provides a feedback path from output terminal 12 to the gate of transistor 13 to accomplish frequency compensation in an amplifier. A problem encountered with output driver 10 is that at sufficiently high signal frequencies, such as at several kHz, capacitor 14 effectively becomes an A.C. short circuit which configures transistor 13 as a diode. The frequency at which the shorting action of capacitor 14 occurs is a function of the capacitor impedance with respect to the resistive impedance to ground of the differential stage's output node coupled to the input of driver 10. When transistor 13 appears as a diode, any signal component at those frequencies has a gain of unity from the input of driver 10 to the output terminal 12. At a low frequency when capacitor 13 is not an A.C. short circuit, the gain between the $V_{SS}$ terminal and output terminal 12 is very low which provides good power supply rejection. However, when the gain between the $V_{SS}$ terminal and output terminal 12 becomes unity, gain stage 10 has a severe power supply rejection problem. If an opposite polarity gain stage, that is a P-channel gain stage having a reversed current source structure, is configured from gain stage 10, the same power supply rejection problem with respect to supply voltage $V_{DD}$ exists.

Figure 2:
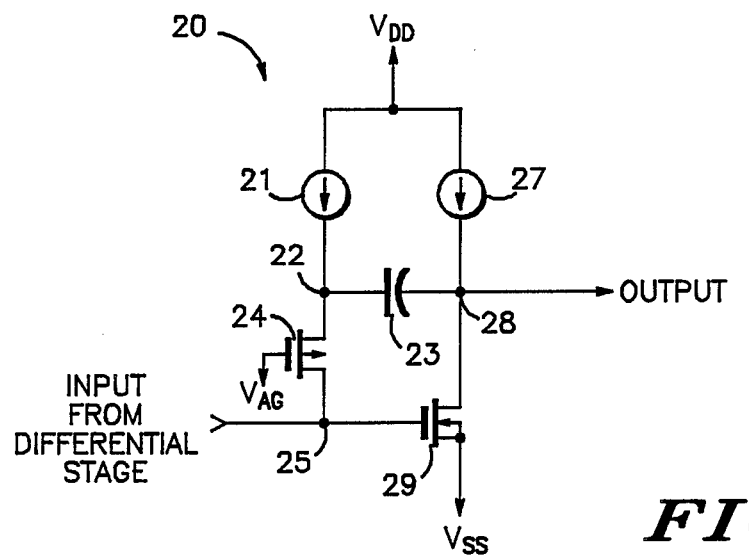

Shown in FIG. 2 is another known output driver 20 which is also a high gain output stage. A current source 21 has a first terminal connected to positive power supply $V_{DD}$, and a second terminal connected to a node 22. A first electrode of a capacitor 23 is connected to node 22, and a source of a P-channel transistor 24 is also connected to node 22. A gate of transistor 24 is connected to an analog ground reference voltage labeled "$V_{AG}$", and a drain of transistor 24 is connected to an input terminal 25. Input terminal 25 receives an input signal from a differential stage. A first terminal of a current source 27 is connected to supply voltage $V_{DD}$, and a second terminal of current source 27 is connected to a second electrode of capacitor 23 at an output terminal 28 for providing an output voltage. A drain of an N-channel transistor 29 is connected to output terminal 28. A gate of transistor 29 is connected to input terminal 25, and both a source and the substrate of transistor 29 are connected together to a negative power supply voltage labeled "$V_{SS}$".

In operation, gain stage 20 is a high gain output driver with improved power supply rejection as compared with gain stage 10. Capacitor 23 functions as a frequency stabilizing capacitor, or "Miller" capacitor, in a manner similar to capacitor 14 of FIG. 1 except capacitor 23 is not directly connected across the drain and gate of current sink transistor 29. Transistor 24 functions as a cascode device which provides an A.C. ground at node 22. In other words, the source of transistor 24 provides a low impedance path to analog ground potential $V_{AG}$. However, the current gain between the source and drain of transistor 24 is unity. Therefore, the same current conducted by capacitor 23 is coupled to the gate of current sink transistor 29 which would have been connected to the gate of transistor 29 if the second electrode of capacitor 23 were directly connected to the gate of transistor 29 analogous to FIG. 1. However, in FIG. 2 the voltage at node 22 is a virtual ground voltage instead of a signal voltage because the second electrode of capacitor 23 has been voltage buffered by cascode transistor 24. In the illustrated form, since the same current thru capacitor 23 is coupled to the gate of transistor 29, the same Miller compensation with pole splitting is performed by capacitor 23 as if the second electrode of capacitor 22 were connected to the gate of transistor 29. At higher frequencies when capacitor 23 becomes a short circuit, transistor 29 does not become diode configured thereby degrading power supply rejection.

In the illustrated form, in order to keep gain stage 20 frequency stabilized, the transconductance of transistor 24 must be large with respect to the transconductance of transistor 29. This result is analytically demonstrated by Ribner and Copeland in the publication referenced above. In low-power filter interstage operational amplifier structures, this requirement is compatible with other design criteria. However, in high output drive applications, the requirement of making the ratio of the transconductances of transistor 24 and transistor 29 large is incompatible with other design criteria necessary for high gain output with no frequency instabilities.

Figure 3:
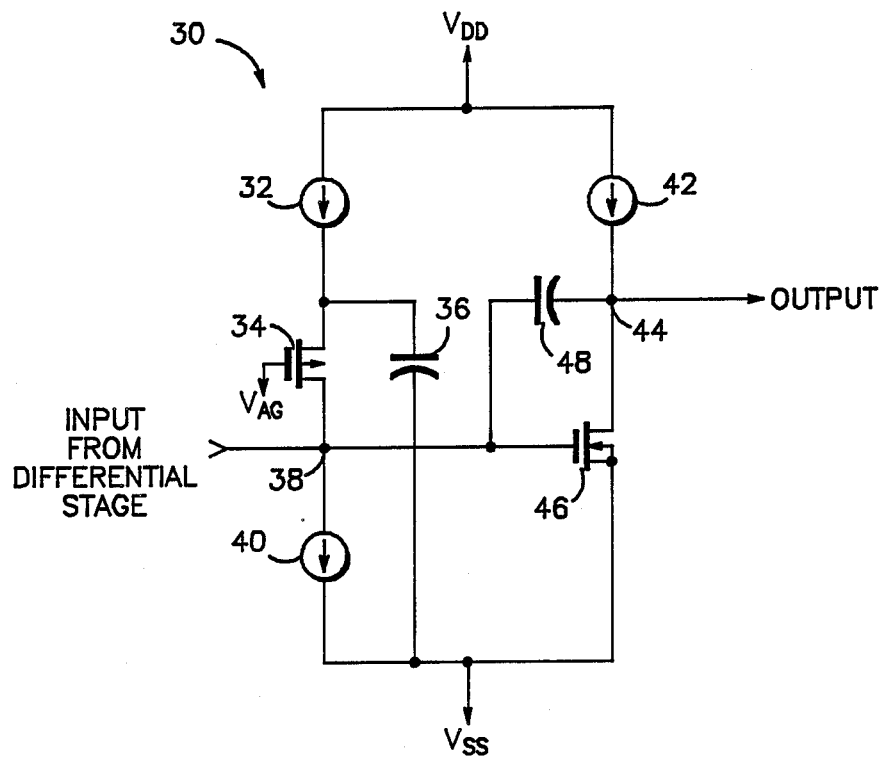

Shown in FIG. 3 is an operational amplifier gain stage 30 in accordance with the present invention. A current source 32 has a first terminal connected to a positive power supply voltage labeled "$V_{DD}$". A second terminal of current source 32 is connected to both a source of a P-channel transistor 34 and a first electrode of a capacitor 36. A second electrode of capacitor 36 is connected to a negative power supply voltage labeled "$V_{SS}$". A gate of transistor 34 is connected to an analog ground reference voltage labeled "$V_{AG}$". A drain of transistor 34 is connected to an input terminal 38 for receiving an input signal from either a conventional differential stage or an amplifier stage. A first terminal of a current sink 40 is connected to power supply voltage $V_{SS}$, and a second terminal of current sink 40 is connected to input terminal 38. A first terminal of a current source 42 is connected to power supply voltage $V_{DD}$, and a second terminal of current source 42 is connected to an output terminal 44. A drain of an N-channel transistor 46 is connected to output terminal 44, and a first electrode of a capacitor 48 is connected to output terminal 44. A second electrode of capacitor 48 is connected to a gate of transistor 46 at input terminal 38. A substrate of transistor 46 is connected to a source of transistor 46 and to power supply voltage $V_{SS}$. While specific N-channel and P-channel MOS devices are shown, it should be clear that gain stage 30 could be implemented by completely reversing the processing techniques (e.g. P-channel to N-channel) or by using other types of transistors.

In operation, the present invention avoids using cascode buffering directly connected between the Miller capacitor 48 and the output sink transistor 46. Transistor 46 and capacitor 48 form a common source MIller compensated output gain stage wherein transistor 46 has a large negative gain, the same in form and function as illustrated in FIG. 1. However, a separate compensation circuit is used to offset the effect of capacitor 48 configuring transistor 46 as a diode at higher frequencies. The separate compensation circuit comprises capacitor 36 and transistor 34. In the illustrated form, thehre are two separate signal paths from power supply $V_{SS}$ to output terminal 44. A first signal path to output terminal 44 from $V_{SS}$ exists when capacitor 48 appears as an A.C. short circuit and a unity gain path exists thru diode configured transistor 46 as has already been described. A second signal path from output terminal 44 to $V_{SS}$ exists thru capacitor 36 to the source of transistor 34 and thru transistor 34 and capacitor 48 to output terminal 44. The source of transistor 34 is an A.C. ground. Therefore, if a change in voltage occurs in power supply $V_{SS}$ and the source of transistor 34 does not change its voltage potential, the change in voltage appeared across capacitor 36 and an amount of charge proportional to the change in voltage across capacitor 36 is pumped into the source of transistor 34. Since transistor 34 has a current gain of unity, the change in current which is coupled to the source of transistor 34 is also coupled to the gate of transistor 46. Current source 32 and current sink 40 are connected in series with cascode transistor 34 to allow current flow thru transistor 34 in a conventional manner. It should be apparent that current sink 40 may be incorporated into the previous amplifier stage which is coupled to input terminal 38. A charge proportional to the current coupled to the gate of transistor 46 is stored by capacitor 48. Therefore, the original change in supply voltage $V_{SS}$ which is charged onto capacitor 36 is charged onto capacitor 48 and the resulting change in voltage on capacitor 48 appears at output terminal 44. However, the change in output voltage resulting from the compensation charge which is coupled onto capacitor 48 through the signal path of capacitor 36 and transistor 34 is of the opposite polariy to the change in output voltage coupled thru capacitor 48 and transistor 46. The opposite polarity results from the fact that there is a net negative gain between the source of transistor 34 and output terminal 44 and a positive gain between the source of transistor 46 and output terminal 44. Therefore, if equal but opposite output error and compensation voltages resulting from signal variations in power supply $V_{SS}$ are coupled to output terminal 44, the net effect is to substantially cancel error voltages due to power supply voltage variations and provide excellent power supply rejection.

As previously mentioned, two equal voltages of opposite polarity caused by power supply variation must be coupled to output terminal 44. Since the gain from $V_{SS}$ thru transistor 46 to output terminal 44 is unity, the other gain path must also have unity gain and be of opposite polarity. However, this does not mean that compensating capacitor 36 is exactly identical to Miller capacitor 48 because there is an additional parasitic capacitance asociated with transistor 46 between the gate and drain of transistor 46. Therefore, capacitor 36 has a capacitive value which is proportional to the effective capacitive value of Miller capacitor 48 including parasitic capacitance so that the power supply voltage coupled to output terminal 44 is equal to the compensation voltage coupled to output terminal 44 thru capacitor 36 and transistor 46. The present invention provides excellent power supply rejection without having to consider the ratio of the transconductances of transistors 34 and 46.

It should be noted that the frequency characteristics of the two paths from $V_{SS}$ to output terminal 44 are not identical. At D.C. the power supply rejection is very good and at high frequency the power supply rejection is very good. For interim frequencies, a region exists where the two frequency characteristics are different and performance is somewhat degraded over those frequencies. However, the error is not a frequency stability error and can be small and may be further minimized by matching the time constants in the two signal paths from $V_{SS}$ to output terminal 44. The time constants are a function of the transconductances of transistors 34 and 44 nd the values of capacitors 36 and 48. Neither capacitor 36 nor transistor 34 have any first or second order effects at the output as far as the primary signal path is concerned because the impedance of cascode transistor 34 connected to input terminal 38 is very high.

By now it should be apparent that a circuit with very high power supply rejection has been provided for amplifier applications where the design requires improved power supply rejection (PSR) and high output current sink/source capability, i.e. high output transconductance. Although the present invention is particularly useful in CMOS power amplifiers, it should be well understood that the present invention may be used in other applications and may be coupled to any type of amplifier structure including operational and differential amplifiers.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. An output gain stage with frequency stability compensation for receiving an input signal at an input terminal and providing an output signal with high power supply rejection, comprising:

an output portion for receiving and amplifying the input signal to provide the output signal at an ouput terminal, said output portion adapted to be coupled to a power supply and having a current source coupled in series with a current sink transistor and a frequency stabilizing capacitor coupled between the input terminal and the output terminal, said output signal having an error component of predetermined polarity resulting from error signals in the power supply; and power supply compensation means coupled to the input terminal, for coupling a compensation component to the output signal, said compensation component having a magnitude substantially equal to the error component and a polarity opposite the predetermined polarity.

2. The output gain stage of claim 1 wherein the power supply compensation means further comprise:

a second current source having a first terminal adapted for coupling to a second power supply, and a second terminal;

a cascode transistor having a first current electrode coupled to the second terminal of the second current source, a second current electrode coupled to the input terminal, and a control electrode coupled to a reference voltage terminal;

a capacitor having a first electrode coupled to the first current electrode of the cascode transistor, and a second electrode coupled to the current sink transistor; and a second current sink having first terminal coupled to the input terminal, and a second terminal adapted to receive the first power supply.

3. A method of providing a frequency stable gain stage with high power supply rejection, comprising the steps of:

coupling a current source transistor in series with a current sink transistor to form an output terminal, said gain stage having an input terminal at a control electrode of the current sink transistor;

coupling a capacitor between the output terminal and the input terminal for maintaining frequency stability, said first capacitor coupling an error component of predetermined polarity to the output resulting from error signals in a power supply voltage coupled thereto when operable; and coupling compensation means to the input terminal for coupling a compensation component to the capacitor and having a magnitude substantially equal to the error component and a polarity opposite the predetermined polarity.

4. In an output gain stage having a current source coupled in series with a first current electrode of a first transistor of a first conductivity type to form an output terminal, a second current electrode coupled to a power supply terminal adapted to receive a power supply voltage, a control electrode coupled to an input terminal, and a first capacitor coupled between the input terminal and the output terminal, wherein the improvement comprises:

compensation means coupled to the input terminal for compensating for error signals of the power supply to improve power supply rejection by charge cancelling the error signals via the capacitor.

5. The output gain stage of claim 4 wherein said compensation means further comprise:

a second current source;

a second transistor of a second conductivity type having a first current electrode coupled to the second current source, a second current electrode coupled to the input terminal, and a control electrode coupled to a reference voltage terminal; and a second capacitor having a first electrode adapted to receive the power supply voltage, and a second terminal coupled to the first current electrode of the second transistor.

6. The output gain stage of claim 5 further comprising:

a current sink coupled to the second transistor for sinking current conducted by the second transistor.

* * * * *